(12) United States Patent
Elliott

(10) Patent No.: US 10,912,237 B2
(45) Date of Patent: Feb. 2, 2021

(54) SYSTEMS AND METHODS FOR HUMIDITY CONTROL IN UTILITY SCALE POWER INVERTERS

(71) Applicant: SCHNEIDER ELECTRIC SOLAR INVERTERS USA, INC., Livermore, CA (US)

(72) Inventor: Jason Elliott, Delta (CA)

(73) Assignee: SCHNEIDER ELECTRIC SOLAR INVERTERS USA, INC., Livermore, CA (US)

( * ) Notice: Subject to any disclaimer, the term of this patent is extended or adjusted under 35 U.S.C. 154(b) by 0 days.

(21) Appl. No.: 16/311,587

(22) PCT Filed: Jun. 19, 2017

(86) PCT No.: PCT/US2017/038102
§ 371 (c)(1),
(2) Date: Dec. 19, 2018

(87) PCT Pub. No.: WO2017/222966
PCT Pub. Date: Dec. 28, 2017

(65) Prior Publication Data
US 2019/0239367 A1    Aug. 1, 2019

Related U.S. Application Data

(60) Provisional application No. 62/352,406, filed on Jun. 20, 2016.

(51) Int. Cl.
*H05K 5/02* (2006.01)
*H05K 7/14* (2006.01)
(Continued)

(52) U.S. Cl.
CPC .......... *H05K 7/20945* (2013.01); *H02M 7/42* (2013.01); *H05K 5/0213* (2013.01); *H05K 7/1432* (2013.01)

(58) Field of Classification Search
CPC .... H05K 7/1432; H05K 7/20; H05K 7/20172; H05K 7/20327; H05K 7/20727;
(Continued)

(56) References Cited

U.S. PATENT DOCUMENTS 5,884,486 A  *  3/1999  Hughes ................... F25B 21/02
                                                  62/279
2003/0010041 A1 *  1/2003  Wessling ................. B64G 1/50
                                                  62/60
(Continued)

FOREIGN PATENT DOCUMENTS

WO    WO-2012152275 A2 * 11/2012 ......... H05K 7/20127
WO       2016054666 A1     4/2016

OTHER PUBLICATIONS

Notification of Transmittal of the International Search Report and the Written Opinion of the International Searching Authority from corresponding PCT/US2017/038102 dated Sep. 22, 2017.

*Primary Examiner* — Zachary Pape
*Assistant Examiner* — Amir A Jalali
(74) *Attorney, Agent, or Firm* — Lando & Anastasi, LLP

(57) ABSTRACT

A power electronics system comprising an environmentally sealed electronics compartment for housing power electronics equipment is provided. The system includes a heater configured to raise the air temperature inside the sealed electronics compartment, an internal environmental sensor for sensing conditions within the sealed electronics compartment, and providing environmental data, and an external environmental sensor for sensing conditions outside the sealed electronics compartment, and providing environmental data, and a controller. The controller is configured to receive environmental data from the internal environmental sensor, and the external environmental sensor, and control the operation of the heater to maintain a set humidity level.

(Continued)

The system further includes a passive water vapor transport membrane placed in the walls of the sealed electronics compartment.

20 Claims, 10 Drawing Sheets

(51) Int. Cl.
*H05K 7/20* (2006.01)
*H02M 7/42* (2006.01)

(58) Field of Classification Search
CPC ........... H05K 7/20436; H05K 7/20809; H05K 7/20945; G06F 1/20
USPC .......................... 361/699, 700–702; 257/714
See application file for complete search history.

(56) References Cited

U.S. PATENT DOCUMENTS

| | | |
|---|---|---|
| 2007/0002536 A1 | 1/2007 | Hall et al. |
| 2012/0201005 A1 | 8/2012 | Barringer et al. |
| 2012/0253571 A1 | 10/2012 | Yun et al. |
| 2012/0279567 A1* | 11/2012 | Alexander ............ H02M 7/003 136/259 |
| 2013/0033822 A1* | 2/2013 | Nishikawara ........ G02B 21/365 361/704 |
| 2013/0068423 A1 | 3/2013 | Campbell et al. |
| 2013/0249460 A1* | 9/2013 | Sugahara .............. H02M 7/797 318/472 |
| 2014/0262177 A1 | 9/2014 | Tang et al. |
| 2015/0323784 A1* | 11/2015 | Chamuczynski .. G02B 27/0006 359/513 |
| 2016/0353612 A1* | 12/2016 | Lee ....................... F24F 3/1603 |

\* cited by examiner

SYSTEMS AND METHODS FOR HUMIDITY CONTROL IN UTILITY SCALE POWER INVERTERS

RELATED APPLICATIONS

This application is a U.S. National Stage Application under 35 U.S.C. § 371 of International Application No. PCT/US2017/038102, filed Jun. 19, 2017, titled SYSTEMS AND METHODS FOR HUMIDITY CONTROL IN UTILITY SCALE POWER INVERTERS, which claims the benefit under 35 U.S.C. § 119(e) of U.S. Provisional Application No. 62/352,406, filed Jun. 20, 2016, titled SYSTEMS AND METHODS FOR HUMIDITY CONTROL IN UTILITY SCALE POWER INVERTERS, both of which are hereby incorporated by reference in their entirety for all purposes.

This application relates to U.S. Patent Application Ser. No. 62/352,431, filed Jun. 20, 2016, titled SYSTEMS AND METHODS FOR THERMAL MANAGEMENT IN UTILITY SCALE POWER INVERTERS, which is incorporated by reference in its entirety for all purposes.

BACKGROUND

Field of Invention

Embodiments of the present invention relate generally to utility scale power inverter's enclosures.

Discussion of Related Art

A power inverter, or inverter, is an electronic device or circuitry that converts direct current (DC) to alternating current (AC). Inverters may be used in a number of different contexts, with different DC power sources (such as lead acid batteries, photovoltaic solar panels, wind turbines, etc.), and may be designed to satisfy different power demands of a system.

Utility scale solar inverters, in particular, convert variable DC output of a photovoltaic (PV) solar panel into a utility frequency AC to provide power to either a commercial electrical grid or a local, off-grid electrical network. Solar inverters are connected to a plurality of photovoltaic cells that provide DC input to the inverter. The inverter comprises at least one DC-to-AC power conversion bridge, associated filter electronics and an AC (output) module. The DC-to-AC power conversion bridge uses a plurality of electronic switches, typically insulated gate bipolar transistors (IGBTs), and diodes to convert the DC input into AC output. For grid-connected inverters providing power to an electricity grid, the AC output is filtered to provide an AC output waveform that is suitable for the grid. Furthermore, solar power inverters have special functions adapted for use with photovoltaic arrays, including maximum power point tracking and anti-islanding protection.

Utility scale power inverters, and in particular, solar inverters, need to be able to operate for long periods of time (e.g., 30 years) in high humidity environments, for example in humid climates and in varied weather conditions that can include rain, fog and snow. Condensation is a serious concern for the high voltage and power components in the product. Condensation can cause corrosion, can decrease the performance reliability and lifespan of sensitive electronic equipment, and under some circumstances may create hazardous conditions.

Typically, the enclosure of a solar inverter (especially a multi-MW solar inverter) is vented to the surrounding environment, and the risk of condensation of moisture on interior components is mitigated by heating the incoming air that is entering the enclosure, and/or incorporating active dehumidifiers within the enclosure. For example, condenser-type dehumidifiers with cooling coils and a circulating refrigerant can be used, or absorption- or adsorption-type dehumidifiers can be used. In some products, a drain hole is provided in the enclosure so that water does not pool inside the enclosure, and/or the electrical equipment is physically arranged to reduce the risk of damage in the event of water ingress or condensation, e.g., arranging components vertically rather than horizontally so that water runs off them, and placing them outside of likely "drip-zones." In some solar inverter products, there is no provision for managing condensation.

SUMMARY

The systems and methods described herein are robust, cost-effective and can require less energy to be used to mitigate the risk of condensation. It allows the electronics to be housed in a sealed compartment, with all the attendant advantages of that approach.

In at least one embodiment in accordance with principles of the present invention, a power electronics system comprising an environmentally sealed electronics compartment for housing power electronics equipment is provided. The system includes a heater configured to raise the air temperature inside the sealed electronics compartment, an internal environmental sensor for sensing conditions within the sealed electronics compartment, and providing environmental data, and an external environmental sensor for sensing conditions outside the sealed electronics compartment, and providing environmental data, and a controller. The controller is configured to receive environmental data from the internal environmental sensor, and the external environmental sensor, and control the operation of the heater to maintain a set humidity level. The system further includes a passive water vapor transport membrane placed in the walls of the sealed electronics compartment. The passive "breather" devices have no moving parts, and are easy to service or replace from the exterior of the compartment.

Most of the time the humidity control system operates passively to regulate pressure and humidity within the sealed electronics compartment—for example, during the day, when the solar inverter is operational the humidity control system can operate passively. This allows the heaters to remain off during typical operating conditions, which reduces power consumption and increases reliability of the overall system. The humidity control system comprises passive devices (for pressure and humidity balancing) during normal operation, and an active sub-system comprising sensor(s) and sensor-controlled heater(s) for use during certain conditions (e.g., start-up).

The power electronics equipment of the system may include an inverter. The internal environmental sensor and the external environmental sensor may be temperature sensors for obtaining temperature information within the sealed electronics compartment and outside the compartment, respectively. The controller within the system may be programmed to analyze the environmental data generated from the sensors to operate the heater in order to optimize the humidity level within the enclosure. In addition to the temperature sensors, other sensors may be employed such as a humidity sensor or dew point sensor. The controller may also employ non-sensor based parameters to control the heater, such as current weather data, sunrise time, or weather forecasts. The controller may also be programmed to control the operation of the power electronics equipment to generate heat within the sealed electronics compartment.

One aspect of the disclosure is directed to a power electronics system. In one embodiment, the system comprises an environmentally sealed electronics compartment for housing power electronics equipment, a heater configured to raise the air temperature inside the sealed electronics compartment, an internal environmental sensor for sensing conditions within the sealed electronics compartment, and providing environmental data, and an external environmental sensor for sensing conditions outside the sealed electronics compartment, and providing environmental data. The system further comprises a controller for receiving environmental data from the internal environmental sensor and the external environmental sensor, and controlling the operation of the heater to maintain a set humidity level. The system further comprises a passive water vapor transport membrane placed in the walls of the sealed electronics compartment.

Embodiments of the system further may include the power electronics equipment embodying an inverter. The internal environmental sensor may include a surface temperature sensor located on a large thermal mass in an interior of the inverter, with the controller being configured to monitor internal dew point and large thermal mass temperature, and to use a control algorithm ensure that the dew point never equals or is above the large thermal mass temperature by heating the components of the inverter or air. At least one of the internal environmental sensor and the external environmental sensor may be one of a temperature sensor, a relative humidity sensor, and a dew point sensor. The system further may include a plurality of protective vents configured to provide passive pressure and dew point equalization within the sealed electronics compartment, each protective vent including the passive water vapor transport membrane. The controller may be programmed to analyze the environmental data to control the operation of the heater. The system further may include additional internal environmental sensors for sensing additional environmental conditions within the sealed electronics compartment and providing environmental data to the controller. The controller may be programmed to analyze at least one non-sensor based parameter, including current weather data, sunrise time, or weather forecasts. The controller may be programmed to control the operation of the power electronics equipment to generate heat within the sealed electronics compartment. The passive water vapor transport membrane may be configured to allow air and water vapor to pass through, and prevents liquid water to pass through. The passive water vapor transport membrane further may be configured to equalize pressure inside the compartment with the external pressure.

Another aspect of the disclosure is directed to a method of controlling humidity in a power electronics system. In one embodiment, the method comprises: sensing internal conditions within a sealed electronics compartment for housing power electronics equipment, and providing environmental data; sensing external conditions outside the sealed electronics compartment, and providing environmental data; receiving environmental data and controlling the operation of a heater to raise the air temperature inside the sealed electronic compartment to maintain a set humidity level; and providing a passive water vapor transport membrane in the walls of the sealed electronics compartment.

Embodiments of the method further may include the power electronics equipment embodying an inverter. Sensing internal conditions within the sealed electronics compartment may be achieved by at least one of a temperature sensor, a relative humidity sensor, and a dew point sensor, and sensing external conditions outside the sealed electronics compartment is achieved by at least one of a temperature sensor, a relative humidity sensor, and a dew point sensor. Providing a passive water vapor transport membrane may include applying a plurality of protective vents configured to provide passive pressure equalization and dew point equalization within the sealed electronics compartment, each protective vent including the passive water vapor transport membrane. The method further may include analyzing the environmental data to control the operation of the heater. The method further may include sensing a second internal condition within the sealed electronics compartment and providing environmental data to a controller. Analyzing the environmental data may include analyzing at least one non-sensor based parameter, including current weather data, sunrise time, or weather forecasts. The power electronics equipment may be controlled to generate heat within the sealed electronics compartment. The passive water vapor transport membrane may be configured to allow air and water vapor to pass through, and to prevent liquid water to pass through. The passive water vapor transport membrane further may be configured to equalize pressure inside the compartment with the external pressure.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

FIGS. 1A-1D show various views of a 2 MW solar inverter enclosure 100, with several access panels or doors allowing access to separate compartments which house different sub-systems within enclosure 100. Like numerals are used to indicate the same or similar components throughout the different views shown in the figures. Solar inverter enclosure 100 can be constructed of aluminum, for good corrosion-resistance. The enclosure may be constructed by assembling a number of separate panels, with gaskets and bolted connections therebetween.

Figure 1A:
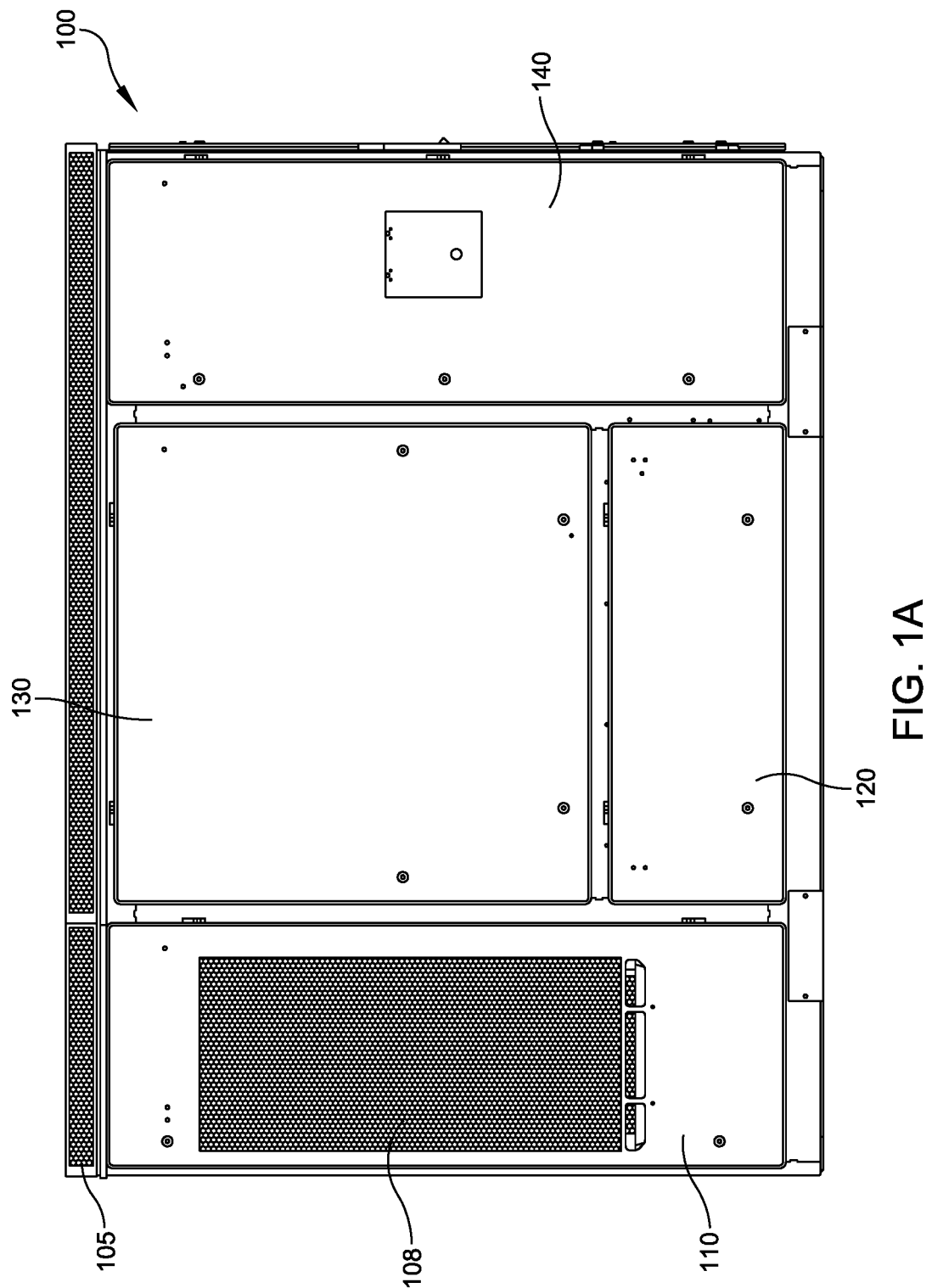
FIG. 1A is a front view of an inverter enclosure of FIG. 1A in accordance with principles of the invention.
Figure 1B:
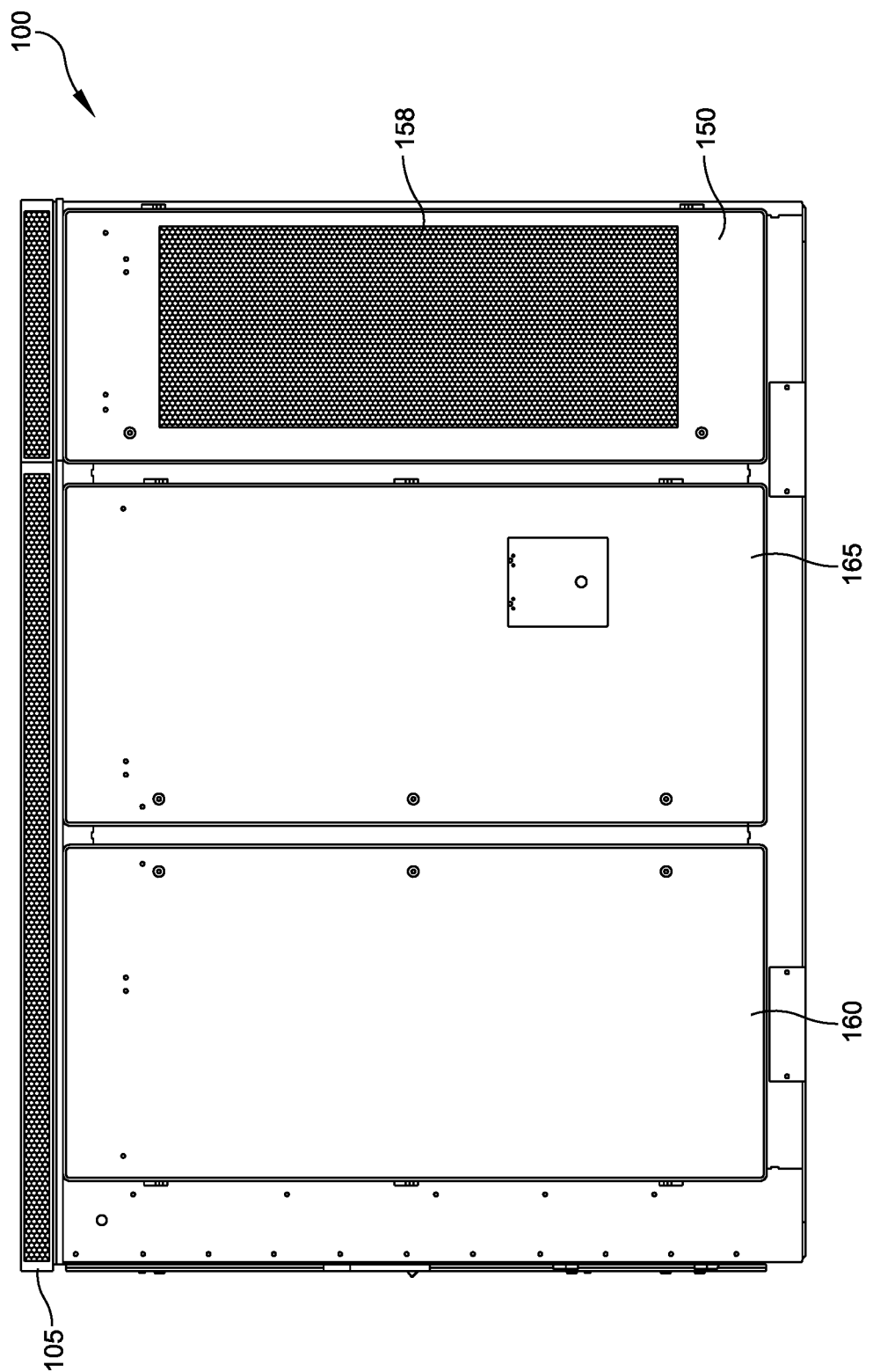
FIG. 1B is a rear view of the inverter enclosure of FIG. 1A in accordance with principles of the invention.
Figure 1D:
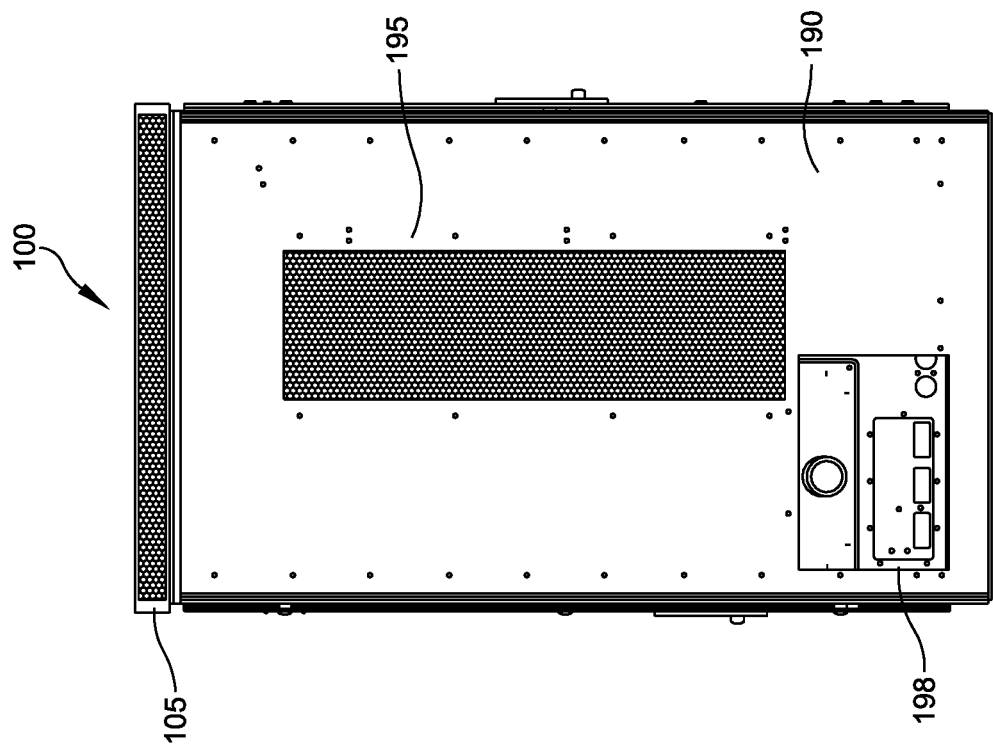
FIG. 1D is a left side view of the inverter enclosure of FIG. 1A in accordance with principles of the invention.
Figure 1C:
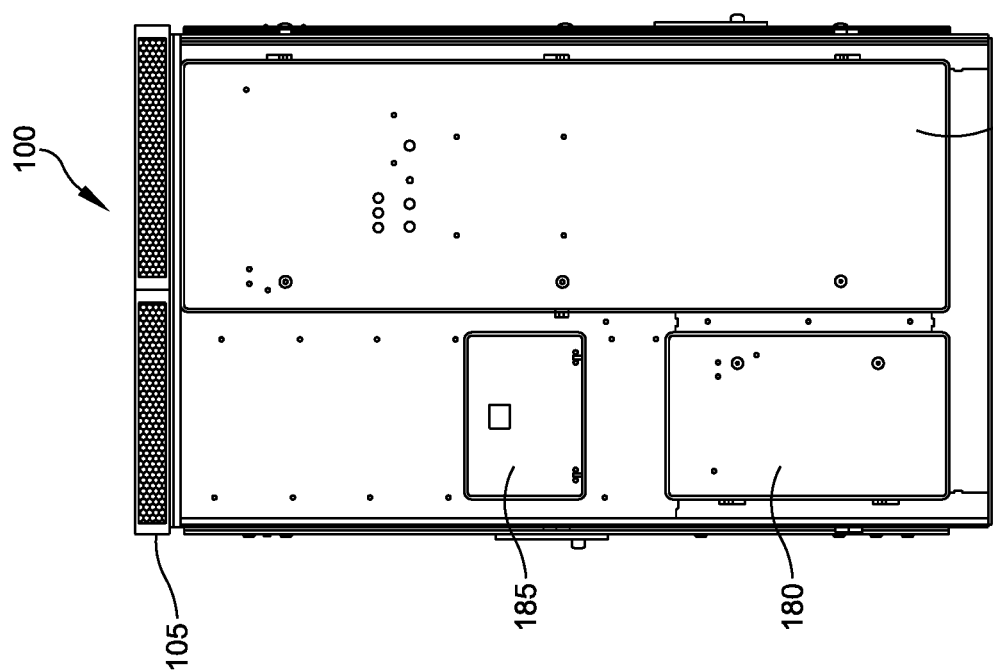
FIG. 1C is a right side view of the inverter enclosure of FIG. 1A in accordance with principles of the invention.

FIG. 1A is a front view of solar inverter enclosure 100, showing vented roof panel assembly 105, cooling cabinet access panel 110, DC cabling compartment access panel 120, and electronics compartment access panels 130 and 140. Cooling cabinet panel 110 includes venting 108 for the passage of air through a portion of the cabinet. FIG. 1B is a rear view of solar inverter enclosure 100, showing vented cooling cabinet access panel 150 having venting 158, and electronics compartment access panels 160 and 165. FIG. 1C is a right-side view of solar inverter enclosure 100, showing communication compartment access panel 170, communication wiring compartment access panel 180, and display cover/laptop tray 185. FIG. 1D is a left-side view of solar inverter enclosure 100, showing vented cooling cabinet end wall 190 with venting 195. The end wall 190 all provides an access panel 198 for connections to various plant components within the enclosure, such as thermal management systems, communications equipment, or electrical connections.

Figure 2A:
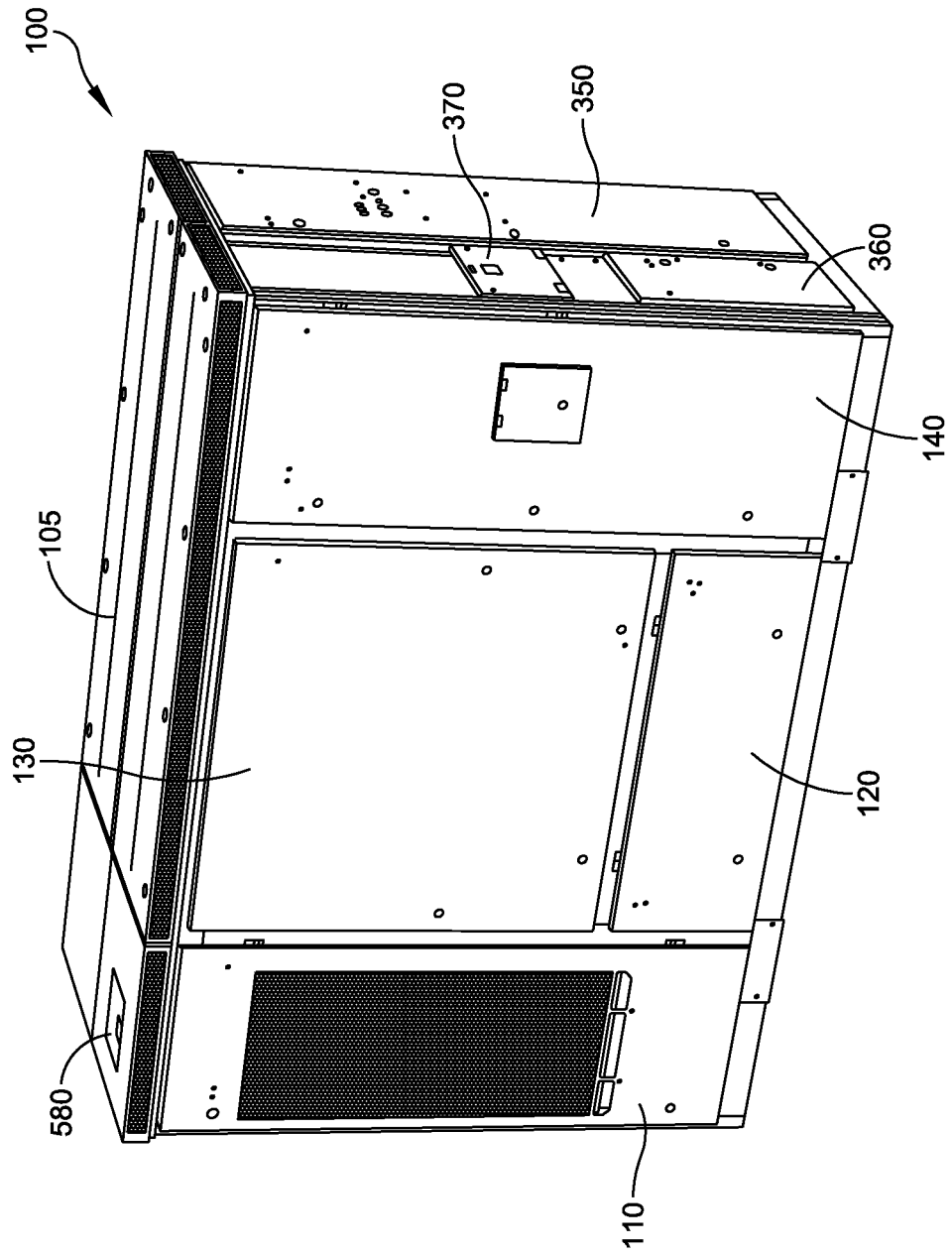
FIG. 2A is a front/topside isometric view of an inverter enclosure in accordance with principles of the invention.
Figure 2B:
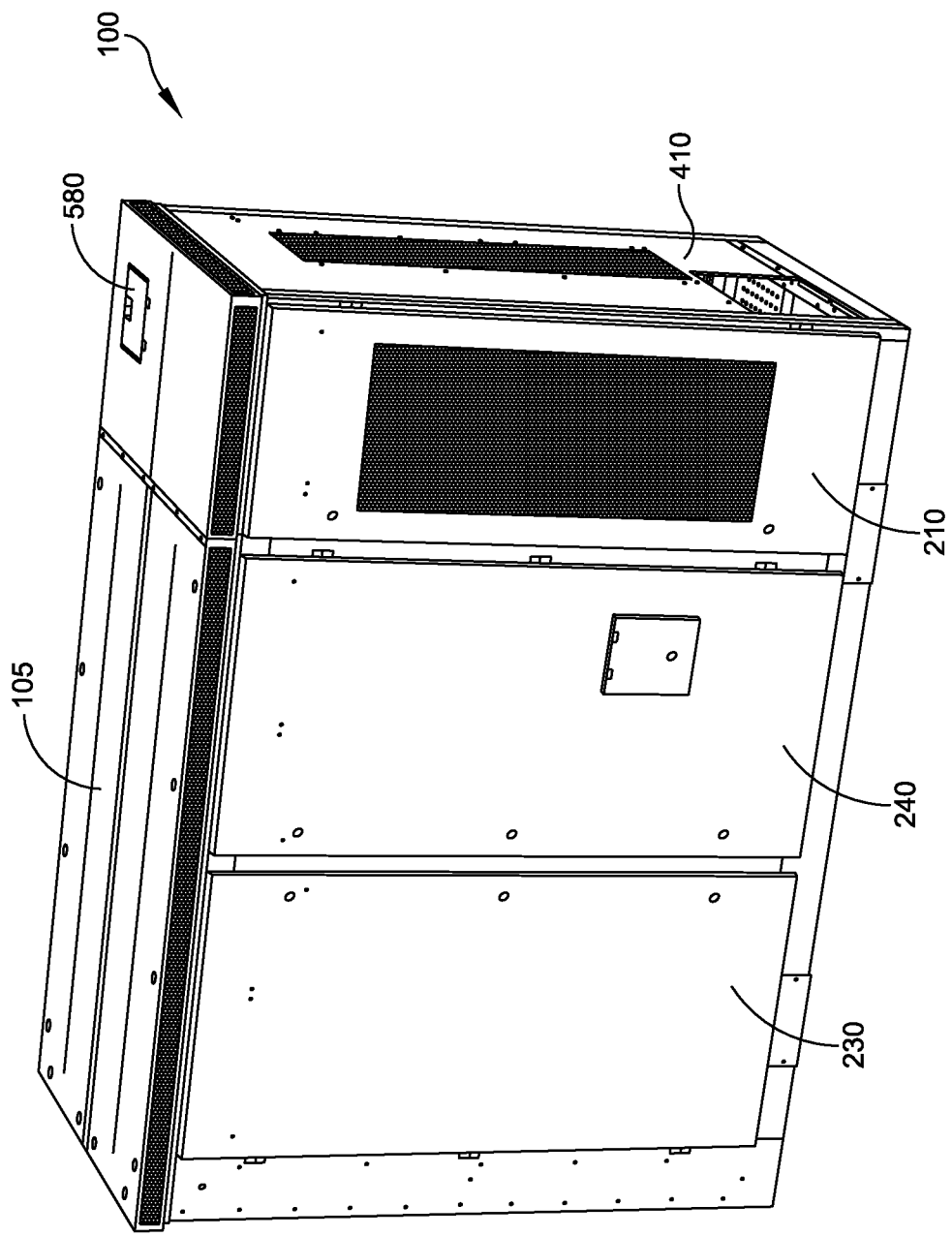
FIG. 2B is a rear/topside isometric view of an inverter enclosure in accordance with principles of the invention.

FIGS. 2A and 2B are front/topside and rear/topside isometric views of solar inverter enclosure 100, showing the various access panels as described above. Coolant reservoir access hatch 580 is visible in FIGS. 2A and 2B. FIG. 2A further illustrates the solar inverter enclosure 100, showing communication compartment access panel 350, communication wiring compartment access panel 360, and display cover/laptop tray 370. FIG. 2B further illustrates the solar inverter enclosure 100, showing vented cooling cabinet access panel 210 having venting, and electronics compartment access panels 230 and 240. FIG. 2B further illustrates the solar inverter enclosure 100, showing vented cooling cabinet end wall 410 with venting. The end wall 410 provides an access panel for connections to various plant components within the enclosure, such as thermal management systems, communications equipment, or electrical connections.

Figure 3A:
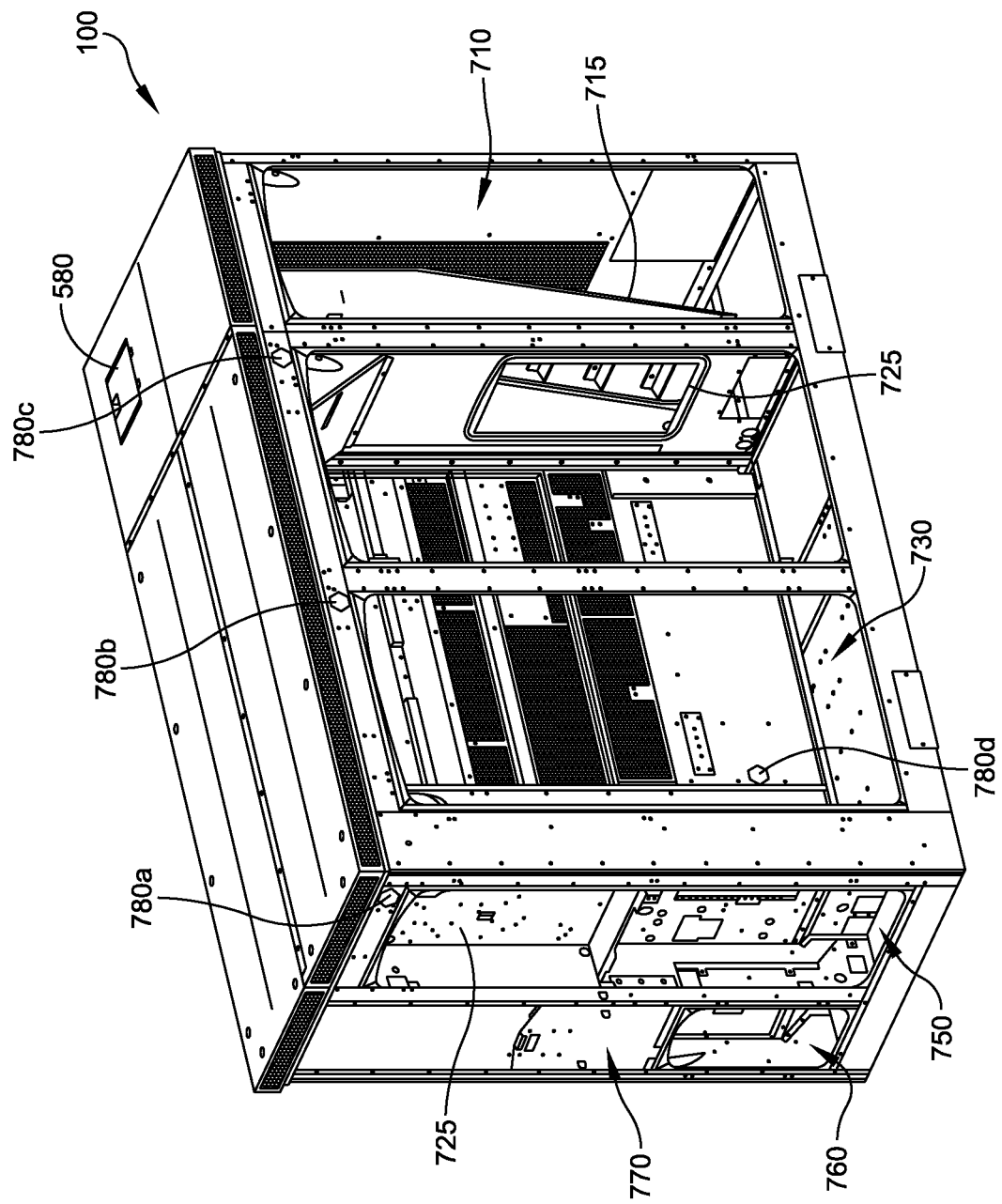
FIG. 3A is a front/topside interior isometric view of an inverter enclosure in accordance with principles of the invention.

FIG. 3A is a rear/topside isometric view of solar inverter enclosure 100 with the access panels removed to reveal various interior compartments that house different subsystems within enclosure 100. FIG. 3A shows cooling cabinet 710 separated from electronics compartment 730 by interior panel 715. Opening 725 accommodates a heat exchanger (not shown). Communication and auxiliary power compartment 750 is separated from electronics compartment 730 by interior panel 725. Communication wiring compartment 760, and display box 770 are shown and are also defined by interior panels (not labelled).

Figure 3B:
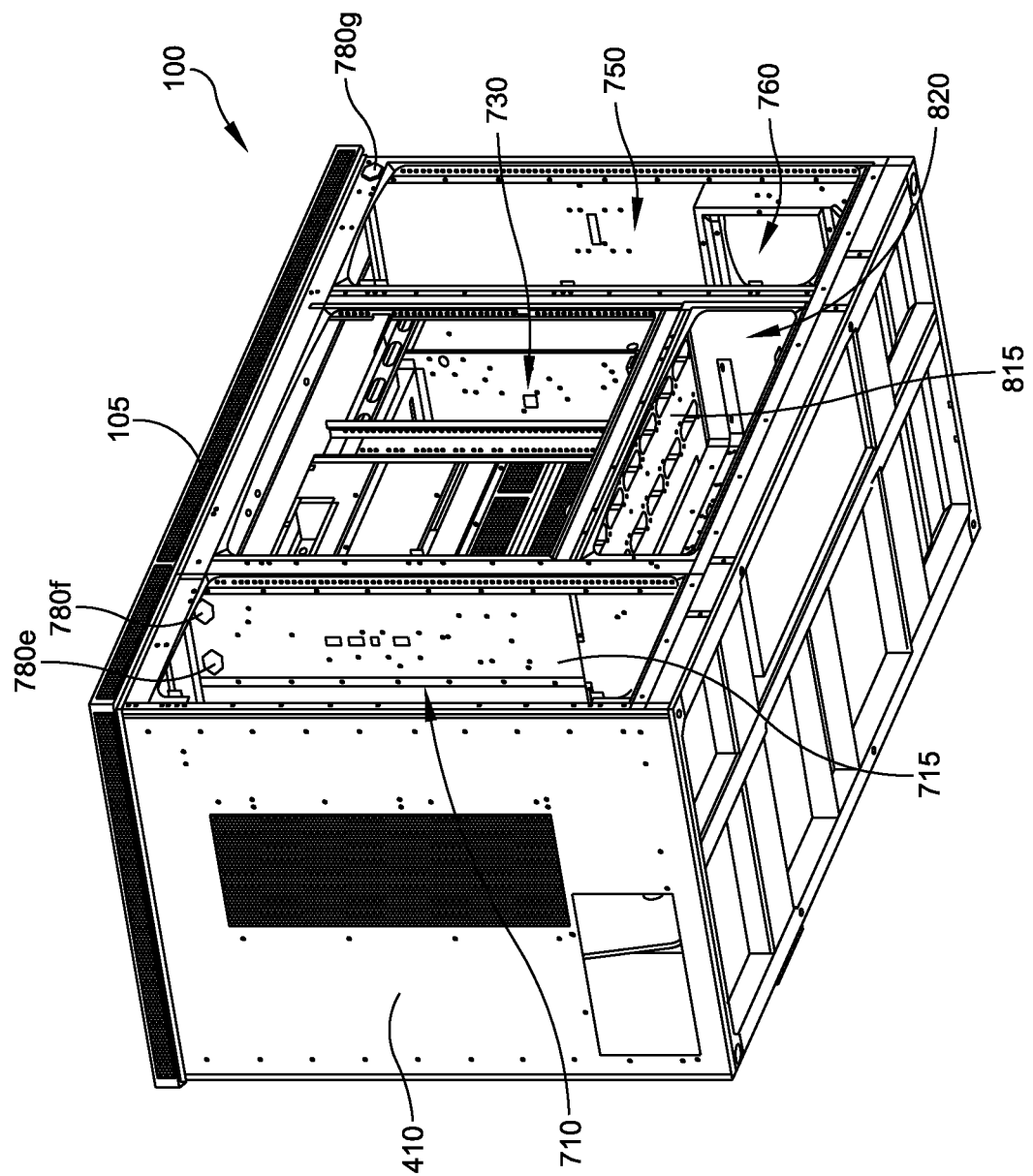
FIG. 3B is a rear/topside interior isometric view of an inverter enclosure in accordance with principles of the invention.

FIG. 3B is a front/underside isometric view of solar inverter enclosure 100, also with the access panels removed to reveal various interior compartments, 710, 730, 750 and 760 as described in reference to FIG. 3A above. FIG. 3B also shows DC cabling compartment 820, which is separated from electronics compartment 730 by interior panel 815.

Unlike in conventional inverters, embodiments of the present invention include a substantially sealed compartment within the utility scale inverter enclosure that houses the electronics (e.g., power conversion bridge and filter electronics etc.). The sealed compartment is designed to block contaminants such as particulates, and prevent ingress of liquid water.

In an assembled solar inverter in accordance with principles of the invention, electronics compartment 730 is substantially sealed to prevent ingress of water or dust into this compartment—it is rated NEMA Type 4 or IP65. Silicone seals are used around the access panels to this compartment. Cooling cabinet 710 is vented or "open-to-environment," and houses heat exchangers and associated ducting, piping, and pumps, etc. (not shown). Sealed liquid pass-throughs into the electronics compartment 730 are used. This allows much of the liquid cooling system to be located outside electronics compartment 730. DC cabling compartment 820 has sealed high power bus pass-throughs into sealed electronics compartment 730. This allows DC field wiring to be completed without exposing the sealed electronics compartment to the environment during installation.

Communication and auxiliary power compartment 750 and communication wiring compartment 760 will be accessed more frequently by the operator, and therefore these components are separated from sealed electronics compartment 730. Communications and low voltage connections enter the solar inverter system via these sections, so that the main electronics compartment 730 is not exposed during installation, commissioning and during some service operations.

There may be some slow ingress of humidity into the substantially sealed compartment under certain conditions. There will be pressure and temperature changes within the sealed electronics compartment—these changes can be related to whether or not the power electronics is operating, and can also be due to fluctuations in the external temperature (night-day, weather). Such pressure and temperature changes within the enclosure can cause water vapor that is present inside the enclosure to condense. Furthermore, pressure differentials (vacuums or pressure build-ups) in the compartment, due to temperature changes, can stress seals and may eventually cause them to fail, allowing moisture and other contaminants such as dust and dirt to enter the compartment.

With a sealed electronics compartment, some approaches could involve active dehumidifiers (such as condenser-type humidifiers), but these would add to system and operational complexity, and tend to reduce product reliability and lifetime. Hygroscopic materials/desiccants could be placed within the electronics compartment, but these would need to be replenished, and it is preferable not to have to access the inside of the compartment for servicing/changing/replenishing the dehumidifying components. Furthermore, the issue of pressure equalization, with changing temperature within the sealed compartment, would still need to be addressed.

Embodiments in accordance with principles of the invention intend to mitigate the risk of moisture condensing on the electronics within the sealed compartment, when the unit is operational, non-operational and during start-up and shutdown. Additionally, they manage pressure changes within the sealed compartment due to temperature changes (so that the pressure differential between the inside of the compartment and the surrounding environment is kept below a threshold value or is preferably zero).

To reduce the risk of condensation from slow ingress of humidity and to manage the changes in pressure due to temperature changes, the humidity control system comprises one or more passive devices, each comprising a water vapor transport membrane, that are placed in the walls of the sealed electronics compartment. These devices allow air and water vapor to pass through via the membrane, but do not allow liquid water to pass through, thus protecting the interior of the compartment from liquid water ingress (e.g., from rain, melting snow or ice and fog). Because air can pass through the device, the pressure inside the compartment equalizes with the external pressure. The membrane acts as a water vapor transport membrane, such that the internal and external humidity (on either side of the membrane) also tend to equilibrate. The devices also effectively block contaminants such as particulates and salts.

Seven protective screw-in vents 780a-g, are installed in various wall panels that define electronics compartment 730 as shown in FIGS. 3A and 3B. These devices provide passive pressure and dew point equalization and humidity control within the compartment 730, as described above. Passive devices comprising a water vapor transport membrane are commercially available. For example, GORE® Protective Vents for Outdoor Electronics Harsh Environments (e.g., Gore Polyvent XL devices, part no. PMF200542), can be used to rapidly equalize pressure, manage condensation and protect sensitive electronics against water and other liquids. These are available with a choice of adhesive, screw-in and snap-in constructions, and in a variety of sizes. In one implementation of a 2 MW solar inverter, the volume of the electronics compartment is approximately 6.25 m$^3$ and 7 screw-in Polyvent XL devices from GORE® are mounted in the walls of the electronics compartment.

During operation of the solar inverter (e.g., during the day), the interior of the electronics compartment is typically hotter than the external ambient temperature, and moisture will tend to exit the compartment (via the water vapor transport membrane devices) before condensation forms.

A solar inverter is typically non-operational at night and therefore cools down overnight. In the morning, the external temperature and dew point tend to rise, and moisture will tend to enter the electronics compartment (via the passive devices). Since there is significant (cold) thermal mass inside the compartment, it will take time to warm up, and condensation could form on components within the compartment during this scenario.

Figure 4:
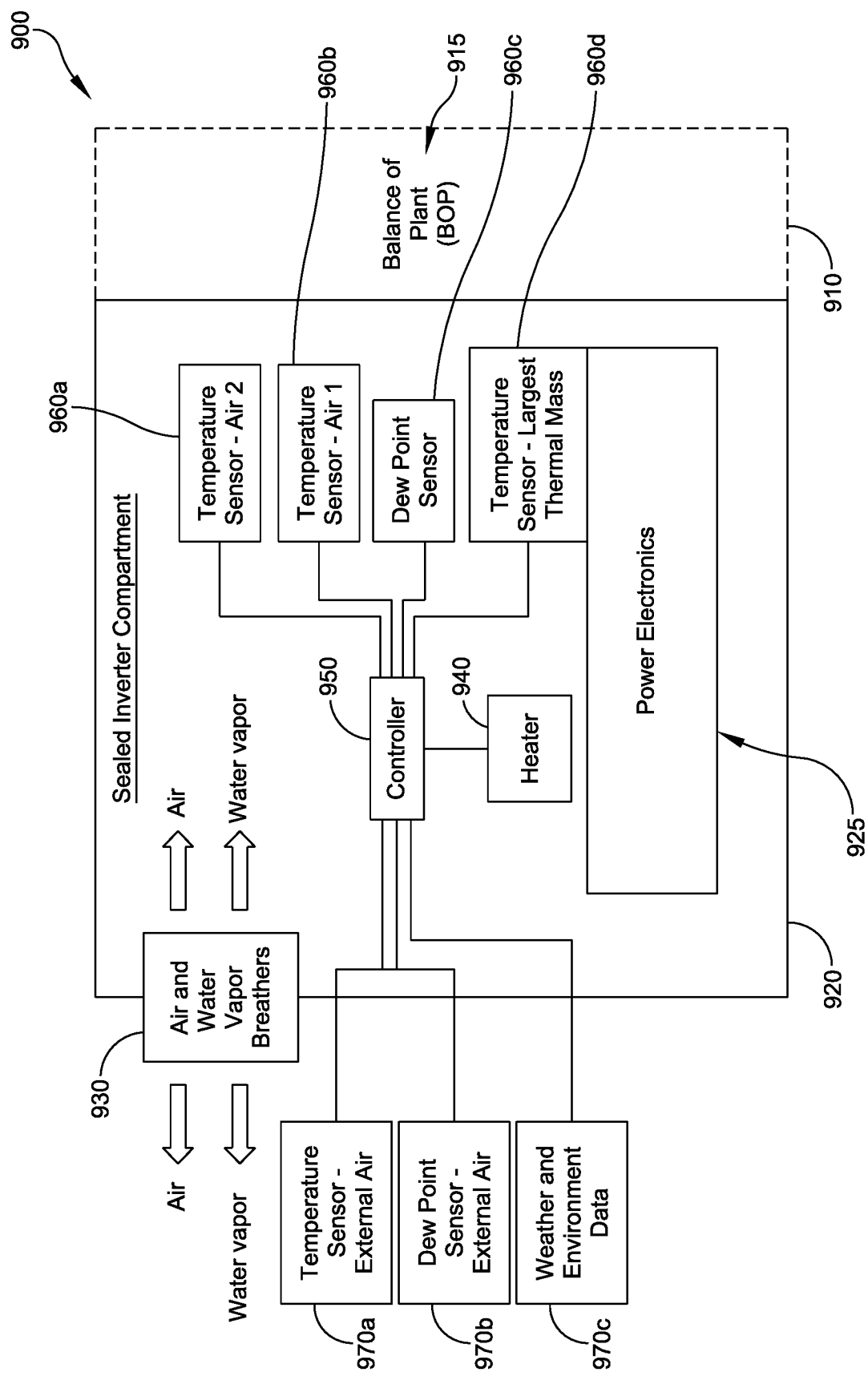
FIG. 4 is a schematic diagram of an inverter enclosure in accordance with principles of the invention.

FIG. 4 is a simplified schematic diagram showing an example of a solar inverter system 900 comprising a vented enclosure 910 housing a substantially sealed electronics compartment 920, and balance of plant components 915 (including a thermal management system, communications equipment, electrical connections etc.). Electronics compartment 920 houses various power electronics components 925 (including power inverters, AC filters etc.). Solar inverter system 900 has a humidity control system comprising a combination of passive and active humidity control devices. One or more passive devices 930, each comprising a water vapor transport membrane, are installed in the walls of sealed electronics compartment 920. These allow passage of air and water vapor in and out of compartment 920 as shown, providing passive pressure equalization and humidity control as described above. The humidity control system further comprises heater 940 and controller 950. These are shown within sealed electronics compartment 920, but either or both could be located outside this compartment, provided heater 940 is positioned to raise the air temperature inside compartment 920 during its operation. The humidity control system further comprises a plurality of sensors 960a-d located inside compartment 920 and a plurality of sensors/devices 970a-c located external to compartment 920. These are connected to controller 950 which controls the operation of heater 940 based on input from these sensors and devices, as described above.

In addition to the one or more passive "breather" devices 930 that are mounted in the walls of the sealed electronics compartment, the humidity control system further comprises at least one sensor for monitoring a condition inside the electronics compartment 920 and one or more heaters 940 for heating the interior of the electronic compartment, and a controller 950, wherein operation of the heater(s) is controlled by the controller, based at least in part on the output of the one or more sensors. The humidity control system may further comprise at least one sensor 970a for monitoring a condition external to the electronics compartment, wherein the at least one external sensor is also used for control of the heater(s) 940.

In some embodiments, the system may comprise a number of different environmental sensors for monitoring conditions external from the electronics compartment 970a-c, or environmental sensors for monitoring conditions internal from the compartment 960a-c. For example, a temperature sensor 960a, 960b may be used to monitor the air temperature (Tc) within the electronics compartment. Temperature sensors 960d may also be used to monitor the temperature of one or more components within the electronics compartment (e.g., could include a sensor to monitor the surface temperature of the largest thermal mass), or a temperature sensor 970a the ambient temperature ($T_A$) (external to the electronics compartment, but in the vicinity thereof). For example, a surface temperature sensor can be located on a large thermal mass in the inverter, e.g., the largest thermal mass in the interior of the inverter. The control system can be configured to monitor the internal dew point and the largest thermal mass temperature. The control system further can be configured to use a control algorithm ensure that the dew point never equals or is above the largest thermal mass temperature by heating the components of the inverter, the air or both.

A dew point sensor 960c may be used to monitor the dew point within the electronics compartment. Other sensors such as relative humidity sensors, pressure sensors and condensation sensors may also be used.

Different control algorithms and strategies may be used to control operation of the humidity control system. In some embodiments, the inverter itself may be operated to assist with heating (raising the temperature within the electronics compartment), e.g., by deliberately power cycling under certain conditions.

In a simple method for controlling the heater(s), when the dew point as sensed by a sensor 960c within the electronics compartment falls to within say 5° C. of the air temperature within the compartment $T_C$, the one or more heaters are activated to increase the temperature within the compartment, thereby reducing or eliminating the formation of condensation within the compartment.

In various embodiments of methods for humidity control, the activation of the heaters to avoid condensation may be based on one or more other factors or parameters such as the rate of change of the ambient temperature ($T_A$), and/or air temperature ($T_C$) within the electronics compartment and/or one or more other sensed parameters. In addition, other factors may include current weather data, sunrise time, or other anticipatory factors such as weather forecasts.

In some cases, machine learning or self-tuning algorithms may be used.

The one or more heaters can be of any suitable type, and can be located within the electronics compartment, or external to the electronics compartment but in a location that allows them to heat the interior of the electronics compartment. In addition, the inverter itself may be operated to assist with heating (raising the temperature within the electronics compartment), e.g., by deliberately power cycling under certain conditions.

Thus, the present humidity control system comprises a combination of passive and active humidity control devices.

Similarly, the present humidity control method involves a combination of passive and active humidity control strategies.

Controller 950 of the inverter system 900 may include, for example, a general-purpose computer such as those based on Intel PENTIUM-type processor, Motorola PowerPC, Sun UltraSPARC, Hewlett-Packard PA-RISC processors, or any other type of processor.

Figure 5:
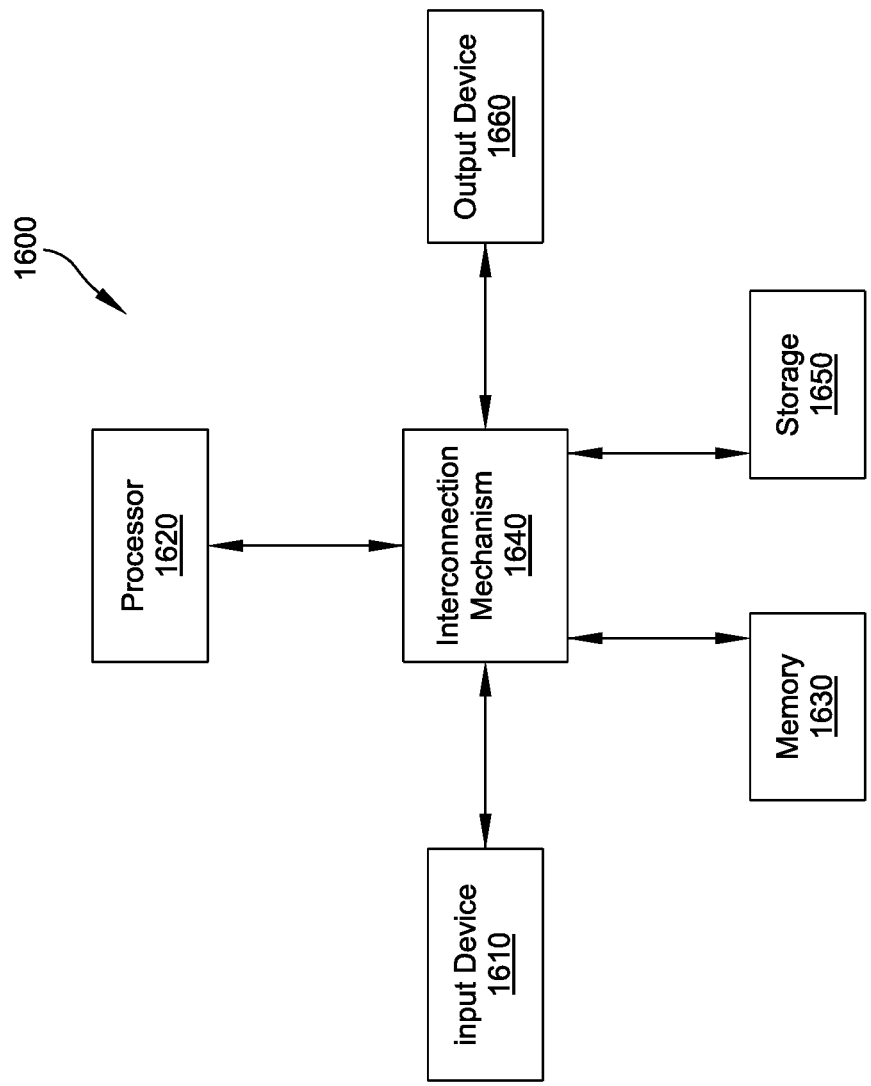
FIG. 5 is a schematic diagram of a controller used in connection with embodiments of the invention.

For example, the methods employed in the controller in various embodiments of the invention may be implemented as specialized software executing in a general-purpose computer system 1600 such as that shown in FIG. 5. The system 1600 may include a processor 1620 connected to one or more memory devices 1630, such as a disk drive, memory, or other device for storing data. Memory 1630 is typically used for storing programs and data during operation of the system 1600. The system 1600 may also include a storage system 1650 that provides additional storage capacity. Components of system 1600 may be coupled by an interconnection mechanism 1640, which may include one or more busses (e.g., between components that are integrated within the same machine) and/or a network (e.g., between components that reside on separate discrete machines). The interconnection mechanism 1640 enables communications (e.g., data, instructions) to be exchanged between system components of system 1600.

System 1600 also includes one or more input devices 1610, for example, a keyboard, mouse, trackball, microphone, touch screen, and one or more output devices 1660, for example, a printing device, display screen, speaker. In addition, computer system 1600 may contain one or more interfaces (not shown) that connect system 1600 to a communication network (in addition or as an alternative to the interconnection mechanism 1640).

Figure 6:
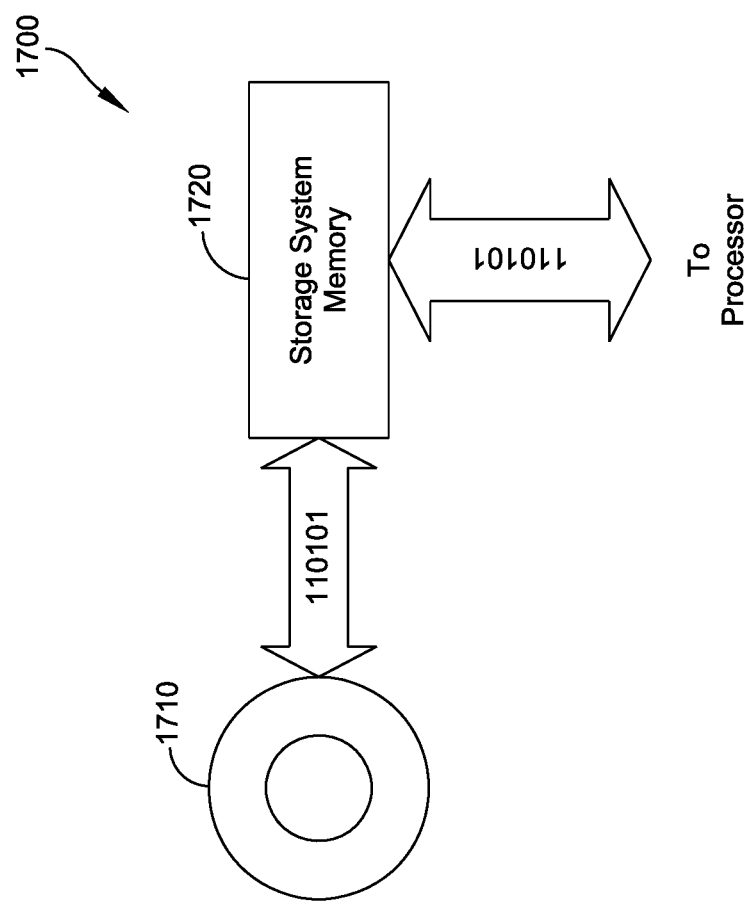
FIG. 6 is a storage system used in connection with FIG. 5.

The storage system 1650, shown in greater detail in FIG. 6, typically includes a computer readable and writeable nonvolatile recording medium 1700 in which signals are stored that define a program to be executed by the processor or information stored on or in the medium 1700 to be processed by the program to perform one or more functions associated with embodiments described herein. The medium may, for example, be a disk or flash memory. Typically, in operation, the processor causes data to be read from the nonvolatile recording medium 1700 into another memory 1710 that allows for faster access to the information by the processor than does the medium 1700. This memory 1710 is typically a volatile, random access memory such as a dynamic random access memory (DRAM) or static memory (SRAM). It may be located in storage system 1720, as shown, or in memory system 1630. The processor 1620 generally manipulates the data within the integrated circuit memory 1630, 1710 and then copies the data to the medium 1700 after processing is completed. A variety of mechanisms are known for managing data movement between the medium 1700 and the integrated circuit memory element 1630, 1710, and the invention is not limited thereto. The invention is not limited to a particular memory system 1630 or storage system 1650.

The computer system may include specially-programmed, special-purpose hardware, for example, an application-specific integrated circuit (ASIC). Aspects of the invention may be implemented in software, hardware or firmware, or any combination thereof. Further, such methods, acts, systems, system elements and components thereof may be implemented as part of the computer system described above or as an independent component.

Although computer system 1600 is shown by way of example as one type of computer system upon which various aspects of the invention may be practiced, it should be appreciated that aspects of the invention are not limited to being implemented on the computer system as shown in FIG. 5. Various aspects of the invention may be practiced on one or more computers having a different architecture or components shown in FIG. 5. Further, where functions or processes of embodiments of the invention are described herein (or in the claims) as being performed on a processor or controller, such description is intended to include systems that use more than one processor or controller to perform the functions.

Computer system 1600 may be a general-purpose computer system that is programmable using a high-level computer programming language. Computer system 1600 may be also implemented using specially programmed, special purpose hardware. In computer system 1600, processor 1620 is typically a commercially available processor such as the well-known Pentium class processor available from the Intel Corporation. Many other processors are available. Such a processor usually executes an operating system which may be, for example, the Windows 95, Windows 98, Windows NT, Windows 2000 (Windows ME) or Windows XP or Vista operating systems available from the Microsoft Corporation, MAC OS System X operating system available from Apple Computer, the Solaris operating system available from Sun Microsystems, or UNIX operating systems available from various sources. Many other operating systems may be used.

The processor and operating system together define a computer platform for which application programs in high-level programming languages are written. It should be understood that embodiments of the invention are not limited to a particular computer system platform, processor, operating system, or network. Also, it should be apparent to those skilled in the art that the present invention is not limited to a specific programming language or computer system. Further, it should be appreciated that other appropriate programming languages and other appropriate computer systems could also be used.

One or more portions of the computer system may be distributed across one or more computer systems coupled to a communications network. For example, as discussed above, a computer system that determines available power capacity may be located remotely from a system manager. These computer systems also may be general-purpose computer systems. For example, various aspects of the invention may be distributed among one or more computer systems configured to provide a service (e.g., servers) to one or more client computers, or to perform an overall task as part of a distributed system. For example, various aspects of the invention may be performed on a client-server or multi-tier system that includes components distributed among one or more server systems that perform various functions according to various embodiments of the invention. These components may be executable, intermediate (e.g., IL) or interpreted (e.g., Java) code which communicate over a communication network (e.g., the Internet) using a communication protocol (e.g., TCP/IP). For example, one or more database servers may be used to store device data, such as expected power draw, that is used in designing layouts associated with embodiments of the present invention.

It should be appreciated that the invention is not limited to executing on any particular system or group of systems. Also, it should be appreciated that the invention is not limited to any particular distributed architecture, network, or communication protocol.

Various embodiments of the present invention may be programmed using an object-oriented programming language, such as SmallTalk, Java, C++, Ada, or C #(C-Sharp). Other object-oriented programming languages may also be used. Alternatively, functional, scripting, and/or logical programming languages may be used. Various aspects of the invention may be implemented in a non-programmed environment (e.g., documents created in HTML, XML or other format that, when viewed in a window of a browser program render aspects of a graphical-user interface (GUI) or perform other functions). Various aspects of the invention may be implemented as programmed or non-programmed elements, or any combination thereof.

Embodiments of a systems and methods described above are generally described for use in relatively large data centers having numerous equipment racks; however, embodiments of the invention may also be used with smaller data centers and with facilities other than data centers. Some embodiments may also be a very small number of computers distributed geographically so as to not resemble a particular architecture.

In embodiments of the present invention discussed above, results of analyses are described as being provided in real-time. As understood by those skilled in the art, the use of the term real-time is not meant to suggest that the results are available immediately, but rather, are available quickly giving a designer the ability to try a number of different designs over a short period of time, such as a matter of minutes.

Having thus described several aspects of at least one embodiment of this invention in considerable detail with reference to certain preferred version thereof, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only. Further, the phraseology and terminology used herein is for the purpose of descriptions and should not be regarded as limiting. The use of "including," "comprising," "having," "containing," "involving," and variations herein, are meant to be open-ended, i.e., "including but not limited to."

The invention claimed is:

1. A power electronics system, comprising:
an environmentally sealed electronics compartment for housing power electronics equipment;
a heater configured to raise the air temperature inside the sealed electronics compartment having an inverter;
an internal environmental sensor for sensing conditions within the sealed electronics compartment, providing environmental data, the internal environmental sensor including a surface temperature sensor located on a large thermal mass in an interior of the inverter;
an external environmental sensor for sensing conditions outside the sealed electronics compartment, and providing environmental data;
a controller for receiving environmental data from the internal environmental sensor and the external environmental sensor, and controlling the operation of the heater to maintain a set humidity level, the controller being configured to monitor an internal dew point and a temperature of the large thermal mass, and to use a control algorithm to ensure that the dew point never equals or is above the large thermal mass temperature by heating components of the inverter or air; and
a passive water vapor transport membrane placed in the walls of the sealed electronics compartment.

2. The system of claim 1, wherein at least one of the internal environmental sensor and the external environmental sensor is one of a temperature sensor, a relative humidity sensor, and a dew point sensor.

3. The system of claim 1, further comprising a plurality of protective vents configured to provide passive pressure and dew point equalization within the sealed electronics compartment, each protective vent including the passive water vapor transport membrane.

4. The system of claim 1, wherein the controller is programmed to analyze the environmental data to control the operation of the heater.

5. The system of claim 4, further comprising additional internal environmental sensors for sensing additional environmental conditions within the sealed electronics compartment and providing environmental data to the controller.

6. The system of claim 4, wherein the controller is programmed to analyze at least one non-sensor based parameter, including current weather data, sunrise time, or weather forecasts.

7. The system of claim 4, wherein the controller is programmed to control the operation of the power electronics equipment to generate heat within the sealed electronics compartment.

8. The system of claim 1, wherein the passive water vapor transport membrane is configured to allow air and water vapor to pass through, and prevents liquid water to pass through.

9. The system of claim 8, wherein the passive water vapor transport membrane further is configured to equalize pressure inside the compartment with the external pressure.

10. The system of claim 1, wherein the controller is further configured to use the control algorithm to ensure that the dew point never equals or is above the large thermal mass temperature by heating components of the inverter by deliberately power cycling the inverter.

11. A method of controlling humidity in a power electronics system, comprising:
sensing, with an internal environmental sensor including a surface temperature sensor located on a large thermal mass in an interior of an inverter, internal conditions within a sealed electronics compartment for housing power electronics equipment having the inverter, and providing environmental data with the internal environmental sensor;
sensing, with an external environmental sensor, external conditions outside the sealed electronics compartment, and providing environmental data with the external environmental sensor;
receiving environmental data and controlling the operation of a heater to raise the air temperature inside the sealed electronic compartment to maintain a set humidity level;
monitoring an internal dew point and a temperature of the large thermal mass;
using a control algorithm to ensure that the dew point never equals or is above the large thermal mass temperature by heating components of the inverter or air; and
providing a passive water vapor transport membrane in the walls of the sealed electronics compartment.

12. The method of claim 11, wherein sensing internal conditions within the sealed electronics compartment is achieved by at least one of a temperature sensor, a relative humidity sensor, and a dew point sensor, and sensing external conditions outside the sealed electronics compartment is achieved by at least one of a temperature sensor, a relative humidity sensor, and a dew point sensor.

13. The method of claim 11, wherein providing the passive water vapor transport membrane includes applying a plurality of protective vents configured to provide passive pressure equalization and dew point equalization within the sealed electronics compartment, each protective vent including the passive water vapor transport membrane.

14. The method of claim 11, further comprising analyzing the environmental data to control the operation of the heater.

15. The method of claim 14, further comprising sensing a second internal condition within the sealed electronics compartment and providing environmental data to a controller.

16. The method of claim 14, wherein analyzing the environmental data includes analyzing at least one non-sensor based parameter, including current weather data, sunrise time, or weather forecasts.

17. The method of claim 14, wherein the power electronics equipment is controlled to generate heat within the sealed electronics compartment.

18. The method of claim 11, wherein the passive water vapor transport membrane is configured to allow air and water vapor to pass through, and to prevent liquid water to pass through.

19. The method of claim 18, wherein the passive water vapor transport membrane further is configured to equalize pressure inside the compartment with the external pressure.

20. The method of claim 11, wherein using the control algorithm to ensure that the dew point never equals or is above the large thermal mass temperature by heating components of the inverter further comprises:

deliberately power cycling the inverter.

* * * * *